US012575162B2

(12) United States Patent
Moon et al.

(10) Patent No.: US 12,575,162 B2
(45) Date of Patent: Mar. 10, 2026

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei City (CN)

(72) Inventors: Joonsuk Moon, Hefei City (CN); Si Zhang, Hefei City (CN); Jo-Lan Chin, Hefei City (CN); Semyeong Jang, Hefei City (CN); Yanlong Li, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 436 days.

(21) Appl. No.: 18/168,513

(22) Filed: Feb. 13, 2023

(65) Prior Publication Data

US 2024/0038862 A1 Feb. 1, 2024

Related U.S. Application Data

(63) Continuation of application No. PCT/CN2022/112183, filed on Aug. 12, 2022.

(30) Foreign Application Priority Data

Jul. 28, 2022 (CN) .......................... 202210900085.3

(51) Int. Cl.
| | |
|---|---|
| *H10D 64/27* | (2025.01) |
| *H10B 12/00* | (2023.01) |
| *H10D 64/01* | (2025.01) |

(52) U.S. Cl.
CPC ......... *H10D 64/513* (2025.01); *H10B 12/053* (2023.02); *H10B 12/34* (2023.02); *H10B 12/488* (2023.02); *H10D 64/01* (2025.01)

(58) Field of Classification Search
CPC .. H10D 64/513; H10D 64/501; H10B 12/053; H10B 12/34; H10B 12/488
See application file for complete search history.

(56) References Cited

U.S. PATENT DOCUMENTS

| | | | |
|---|---|---|---|
| 9,064,956 B2 | 6/2015 | Oh | |
| 9,634,109 B2 | 4/2017 | Oh | |

(Continued)

FOREIGN PATENT DOCUMENTS

| | | |
|---|---|---|
| CN | 108063140 A | 5/2018 |
| CN | 112670269 A | 4/2021 |

(Continued)

*Primary Examiner* — Richard A Booth
(74) *Attorney, Agent, or Firm* — Syncoda LLC; Feng Ma

(57) ABSTRACT

A semiconductor structure includes a peripheral region and an array region. A substrate is provided. An active layer is provided in the substrate corresponding to the peripheral region. A word line groove is formed in the substrate corresponding to the array region. A word line is formed in the word line groove. The word line includes a first word line conductive layer and a second word line conductive layer with one stacked on another. A top of the first word line conductive layer is a protrusion. The protrusion protrudes along a direction pointing from the first word line conductive layer to the second word line conductive layer. An isolation layer covering the substrate is formed. A first through hole and a second through hole both penetrating through the isolation layer are formed simultaneously. The first through hole exposes the active layer. The second through hole exposes the protrusion.

15 Claims, 20 Drawing Sheets

(56)　　　　　　References Cited

U.S. PATENT DOCUMENTS

| | | | |
|---|---|---|---|
| 2021/0358920 A1 | 11/2021 | Luo et al. | |
| 2023/0389295 A1* | 11/2023 | Lu | H10B 12/488 |
| 2024/0021518 A1* | 1/2024 | Lu | H01L 21/76877 |

FOREIGN PATENT DOCUMENTS

| | | | |
|---|---|---|---|
| CN | 113035870 A | 6/2021 |
| CN | 113539972 A | 10/2021 |
| CN | 113707610 A | 11/2021 |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation of International Patent Application No. PCT/CN2022/112183 filed on Aug. 12, 2022, which claims priority to Chinese Patent Application No. 202210900085.3 filed on Jul. 28, 2022. The disclosures of the above-referenced applications are hereby incorporated by reference in their entirety.

BACKGROUND

A Dynamic Random Access Memory (DRAM) in a semiconductor structure is a semiconductor memory widely used in computer systems. A DRAM mainly serves to represent a binary bit 1 or 0 stored by the DRAM using an amount of electric charge stored in a capacitor. A DRAM includes an array region and a peripheral region. A memory unit is provided in the array region. A peripheral circuit is provided in the peripheral region. The peripheral circuit may control access of the memory unit.

However, a number of process steps are required to form a DRAM, causing a high production cost.

SUMMARY

The present disclosure relates to the field of semiconductors, and more particularly, to a method for manufacturing a semiconductor structure and a semiconductor structure.

According to some embodiments of the present disclosure, an aspect herein provides a method for manufacturing a semiconductor structure. The method includes: providing a substrate, an active layer being provided in the substrate corresponding to the peripheral region; forming a word line groove in the substrate corresponding to the array region; forming a word line in the word line groove, the word line including a first word line conductive layer and a second word line conductive layer with one stacked on another, a top of the first word line conductive layer being a protrusion, the protrusion protruding along a direction pointing from the first word line conductive layer to the second word line conductive layer; forming an isolation layer covering the substrate; and simultaneously forming a first through hole and a second through hole both penetrating through the isolation layer, the first through hole exposing the active layer, the second through hole exposing the protrusion.

According to some embodiments of the present disclosure, another aspect herein provides a semiconductor structure. The semiconductor structure includes: a substrate, an active layer being provided in the substrate corresponding to the peripheral region; a word line formed in the substrate corresponding to the array region, the word line including a first word line conductive layer and a second word line conductive layer with one stacked on another, a top of the first word line conductive layer being a protrusion, the protrusion protruding along a direction pointing from the first word line conductive layer to the second word line conductive layer; and an isolation layer covering the substrate, a first contact structure and a second contact structure being formed in the isolation layer, the first contact structure being connected to the active layer, the second contact structure being connected to the word line.

BRIEF DESCRIPTION OF THE DRAWINGS

The accompanying drawings, which are incorporated in and constitute a part of this description, illustrate embodiments consistent with the present disclosure and, together with the description, serve to explain the principles of the present disclosure. Note that the drawings described below refer merely to some embodiments of the present disclosure. A person having ordinary skill in the art may acquire other drawings according to the drawings herein with no creative effort.

DETAILED DESCRIPTION

A number of process steps are required for a DRAM, causing a high production cost. According to analysis, a main reason is as follows. A first through hole is to be formed in a peripheral region of the DRAM to expose an active layer and form a contact structure. A second through hole is to be formed in an array region of the DRAM to expose a first word line conductive layer and form a contact structure. However, compared to the active layer, the first word line conductive layer is located at a greater depth in the substrate. If the first through hole and the second through hole are formed simultaneously, the active layer may be overetched, or the first word line conductive layer may not be exposed, thereby lowering performance of the semiconductor structure. Therefore, the first through hole and the second through hole are generally formed in different process steps, causing a high production cost.

Embodiments of the present disclosure provide a method for manufacturing a semiconductor structure, including that: a protrusion is formed atop a first word line conductive layer, and an isolation layer is etched to form a second through hole exposing the protrusion. That is, by having the protrusion protrude upwards, a difference between depths of the first word line conductive layer and of an active layer in a substrate is reduced, allowing integration of process steps of a first through hole and of a second through hole, thereby reducing a production cost.

Embodiments of the present disclosure are elaborated below with reference to the drawings. However, a person having ordinary skill in the art may understand that in embodiments of the present disclosure, a number of technical details are proposed in order to provide a better understanding of embodiments of the present disclosure. Nevertheless, a claimed technical solution according to embodiments of the present disclosure is implemented even without the technical details and various changes and modifications based on the following embodiments.

As shown in FIG. 1 to FIG. 20, an embodiment of the present disclosure provides a method for manufacturing a semiconductor structure. Note that for convenience of description and clear illustration of steps of the method for manufacturing a semiconductor structure, FIG. 1 to FIG. 20 each are a diagram of a part of the semiconductor structure. The method for manufacturing a semiconductor structure is elaborated below with reference to the drawings.

Figure 1:
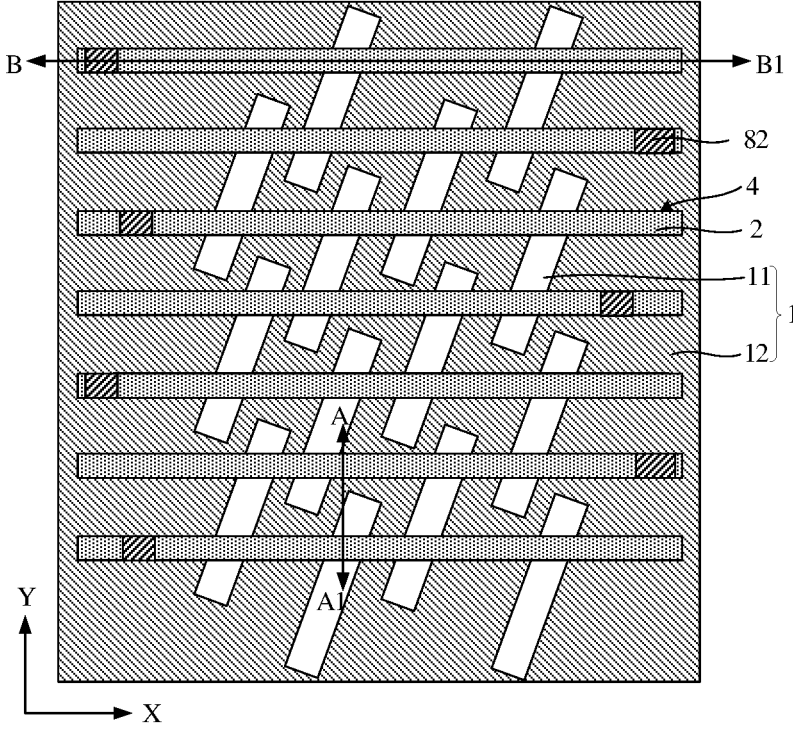
FIG. 1 is a top view of an array region of a semiconductor structure according to an embodiment of the present disclosure.

FIG. 1 illustrates an array region of a semiconductor structure formed in the end. Referring to FIG. 1, the semiconductor structure may include a first direction X and a second direction Y. A word line 2 may extend along the first direction X. Word lines 2 may be arranged along the second direction Y, i.e., a direction perpendicular to a side wall of a word line groove 4 (referring to FIG. 2). The first direction X may be perpendicular to the second direction Y. Both the first direction X and the second direction Y may be parallel to a surface of the substrate 1.

Figure 2:
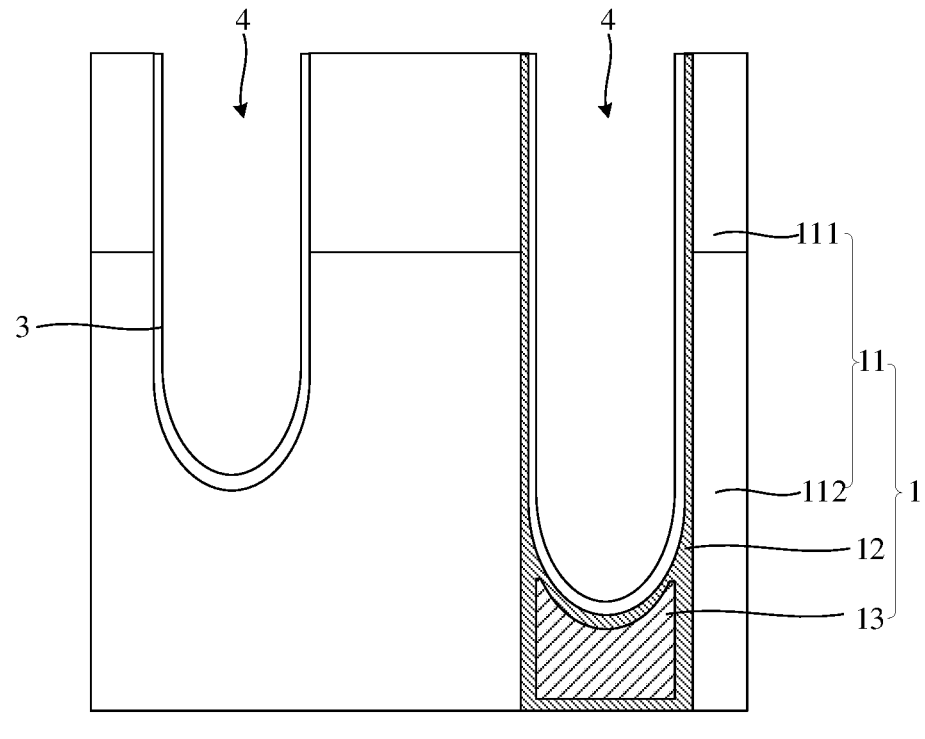
FIG. 2 illustrates a first diagram of a structure corresponding to a step in a method for manufacturing a semiconductor structure according to an embodiment of the present disclosure.

FIG. 2 is a sectional view of the semiconductor structure in the direction A-A1 shown in FIG. 1. Referring to FIG. 2, a substrate 1 is provided. A word line groove 4 is formed in the substrate 1 corresponding to the array region. Specifically, the substrate 1 corresponding to the array region includes a first insulation structure 12, a second insulation structure 13 and multiple active regions 11 separate from each other. Illustratively, the first insulation structure 12 may be of silicon nitride. The second insulation structure 13 may be of silicon oxide. The active regions 11 may be made of silicon or germanium. An active region 11 may include a source drain region 111 and a channel region 112. The source drain region 111 is located above the channel region 112. The source drain region 111 may be located on both sides of the top of a word line groove 4 The channel region 112 may be located below the word line groove 4 and on both sides of the bottom of the word line groove 4. The source drain region 111 may include a source and a drain. The source and the drain may be located respectively on different sides of the word line groove 4. The source drain region 111 and the channel region 112 may contain doping ions of opposite types. For example, the channel region 112 may contain P-type doping ions, and the source drain region 111 may contain N-type doping ions.

A word line groove 4 may be formed in the substrate 1 as follows. Part of the first insulation structure 12 and part of the active region 11 may be removed by dry etching. Illustratively, referring to FIG. 1-FIG. 2, word line grooves 4 may extend along the first direction X. There may be multiple word line grooves 4. The multiple word line grooves 4 may be arranged along the second direction Y. In the first direction X, some word line grooves 4 may be embedded in the first insulation structure 12, and some word line grooves 4 may be embedded in the active regions 11. A word line groove 4 embedded in an active region 11 may be at a shallower depth than a word line groove 4 embedded in the first insulation structure 12.

Refer again to FIG. 2. A dielectric layer 3 may be formed in a word line groove 4. Illustratively, a conformal covering high-dielectric-constant material may be formed as the dielectric layer 3 on the inner wall of the word line groove 4 by atomic layer deposition, in situ steam generation, etc. Material of a high dielectric constant may reduce a gate leakage. Material of a high dielectric constant may be zirconium oxide, aluminum oxide, silicon oxide, silicon nitride, hafnium oxide, niobium oxide, etc.

Figure 3:
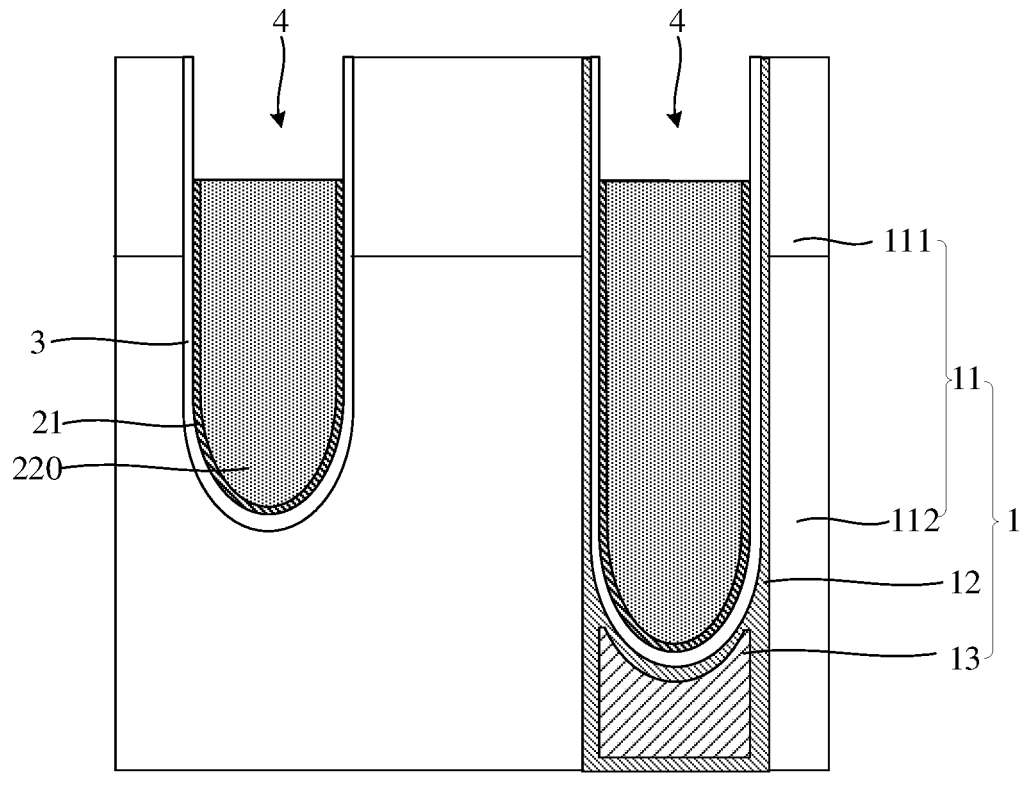
FIG. 3 illustrates a second diagram of a structure corresponding to a step in a method for manufacturing a semiconductor structure according to an embodiment of the present disclosure.

Referring to FIG. 3, a first barrier layer 21 may be formed in a word line groove 4. The first barrier layer 21 may further cover the surface of the dielectric layer 3. Illustratively, the first barrier layer 21 may be made of a metal nitride, such as titanium nitride, tantalum nitride, tungsten nitride, etc. The first barrier layer 21 may prevent metal atoms in the first word line conductive layer 22 subsequently formed from diffusing into the dielectric layer 3, improving reliability of the semiconductor structure.

In some embodiments, the first barrier layer 21 may have a high work function, accordingly reducing the amount of doping in the channel region 112, thus lowering a junction leakage, further increasing retention time of the DRAM.

Refer again to FIG. 3, an initial first word line conductive layer 220 may be formed in the word line groove 4. Illustratively, an initial first word line conductive layer 220 filling the word line groove 4 may be formed by chemical vapor deposition. Thereafter, a first etching process may be performed so that an upper surface of the initial first word line conductive layer 220 is lower than an upper surface of the substrate 1. I.e., the height of the initial first word line conductive layer 220 in the word line groove 4 may be reduced. The initial first word line conductive layer 220 subject to the first etching process may have a top surface that is relatively flat. Illustratively, the top surface of the initial first word line conductive layer 220 subject to the first etching process may be higher than the bottom of the source drain region 111.

Illustratively, the initial first word line conductive layer 220 may be made of metal of low resistance, such as tungsten, titanium, etc. Metal of low resistance allows to increase an operating rate of the semiconductor structure and reduce power consumption.

Figure 4:
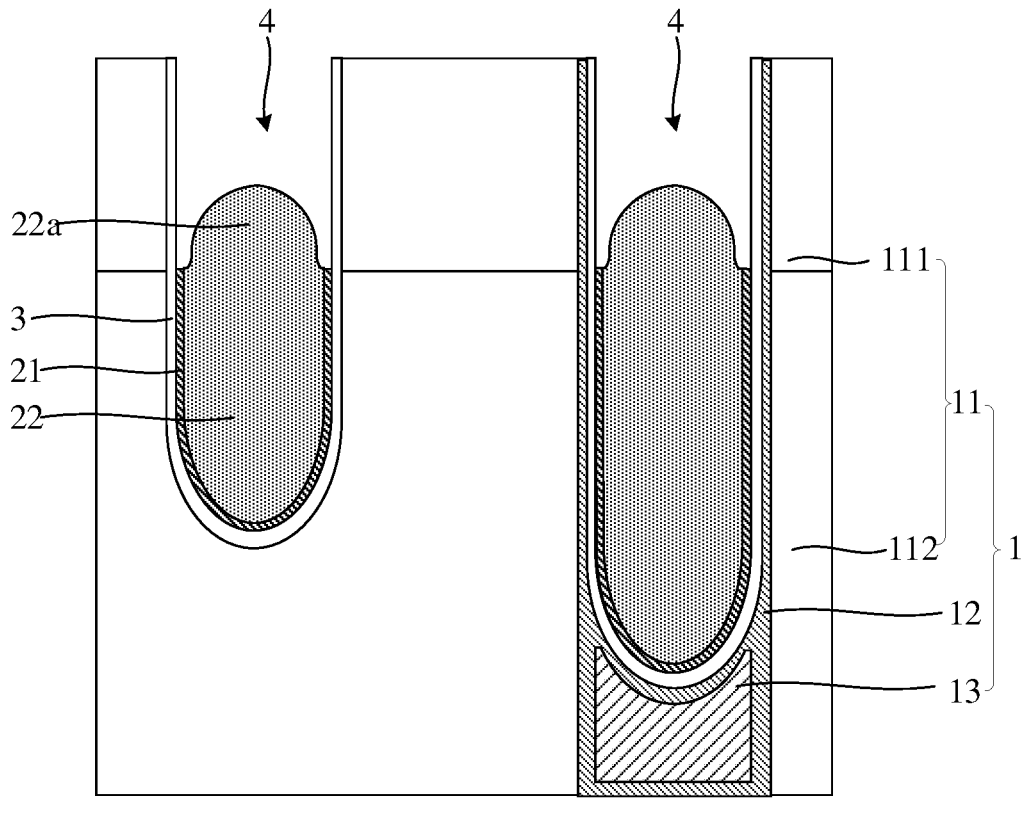
FIG. 4 illustrates a third diagram of a structure corresponding to a step in a method for manufacturing a semiconductor structure according to an embodiment of the present disclosure.
Figure 5:
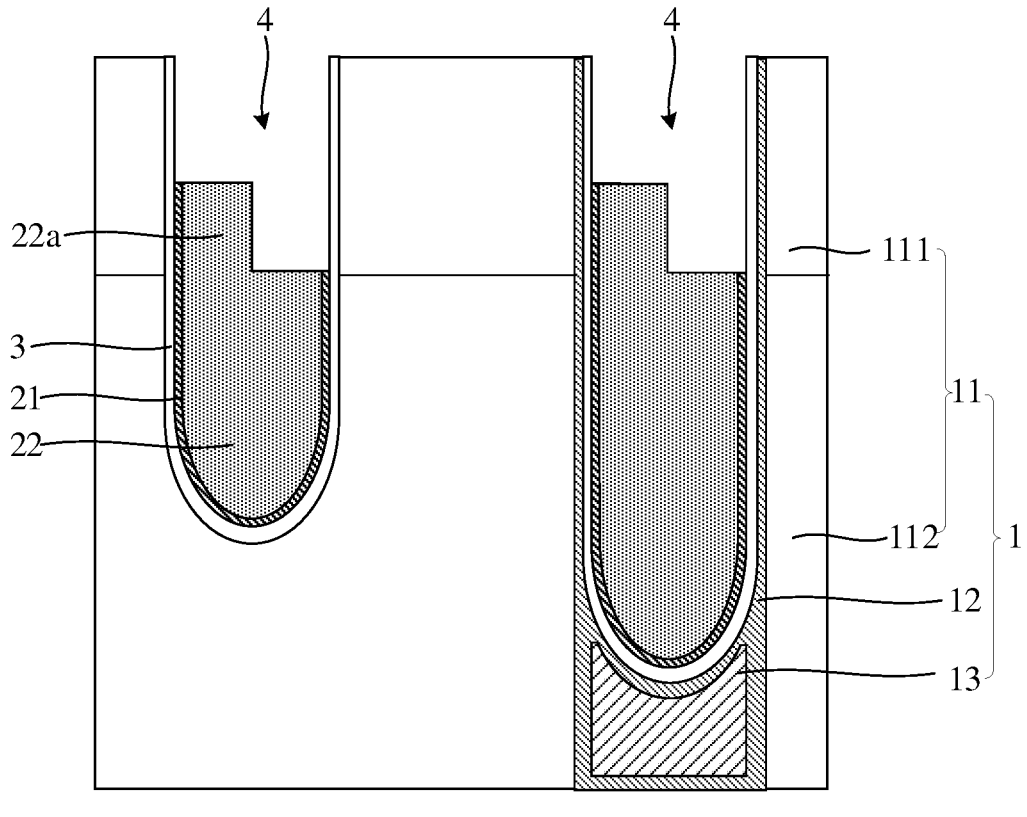
FIG. 5 illustrates a fourth diagram of a structure corresponding to a step in a method for manufacturing a semiconductor structure according to an embodiment of the present disclosure.

Referring to FIG. 4-FIG. 5, a second etching process may be performed to shape the top of the initial first word line conductive layer 220 into the protrusion 22*a*, with a remaining part of the initial first word line conductive layer 220 serving as the first word line conductive layer 22. The protrusion 22*a* may be configured to increase the height of the first word line conductive layer 22, and increase the volume of the first word line conductive layer 22, thereby reducing the resistance of the first word line conductive layer 22. The periphery of the side wall of the protrusion 22*a* may serve to provide space for a second word line conductive layer 24 subsequently formed. The top of the protrusion 22*a* may be higher than the bottom surface of the source drain region 111. The bottom end of the protrusion 22*a* may be of the same height as, or lower than, the bottom surface of the source drain region 111.

Illustratively, the initial first word line conductive layer 220 has two opposite sides arranged in the second direction Y. The initial first word line conductive layer 220 may be etched from the two opposite sides, forming the protrusion 22*a* protruding upward in the middle of the word line groove 4. I.e., the top of the protrusion 22*a* may be provided spaced apart from the side wall of the word line groove 4. In addition, etching widths at the opposite sides may be identical. That is, the top of the protrusion 22*a* may be at equal distance to two opposite side walls of the word line groove 4. In this way, the uniformity of the semiconductor structure is improved, and the manufacturing process is simpler.

In some other embodiments, referring to FIG. 5, the initial first word line conductive layer 220 may be etched from close to one side of the word line groove 4. That is, the top of the protrusion 22*a* may be in contact with the word line groove 4. In other words, the protrusion 22*a* may be in contact with one side of the word line groove 4 and be spaced apart from the other side of the word line groove 4. For example, the protrusion 22*a* may be in contact with the side of the word line groove 4 close to the source, and be spaced apart from the side of the word line groove 4 close to the drain.

Note that the protrusion 22*a* may extend along an extension direction same as that of the word line groove 4, parallel to an upper surface of the substrate 1, and the protrusion 22*a* and the word line groove 4 may be equal in length along the extension direction. That is, the entire initial first word line conductive layer 220 may be etched from either side or both sides along the first direction X, which may form a strip-shaped protrusion 22*a*. Therefore, a separate mask is not required, simplifying a production process. In some other embodiments, the protrusion 22*a* may also be block-shaped and located at an edge of the active region 11 adjacent to the word line 2.

Referring to FIG. 4-FIG. 5, the protrusion 22*a* may be provided facing the source drain region 111. The first word line conductive layer 22 below the protrusion 22*a* may be provided facing the channel region 112. Note that the first word line conductive layer 22 may have a high work function, thereby increasing a difference between work functions of the first word line conductive layer 22 and of the channel region 112. The difference in the work functions may form an electric field between the first word line conductive layer 22 and the channel region 112. The electric field allows to enhance the effect of a word line threshold voltage, i.e., improve the utilization of the word line voltage. In other words, the electric field allows to lower the word line threshold voltage, thereby reducing power consumption. In addition, the protrusion 22*a* allows to reduce an overlap area of the first word line conductive layer 22 with the source drain region 111, thereby reducing a Gate-Induced Drain Leakage (GIDL) caused by a high work function of the first word line conductive layer 22.

The thickness of the protrusion 22*a* in the direction perpendicular to the upper surface of the substrate 1 may be greater than 20 nm in the direction pointing from the first word line conductive layer 22 to the second word line conductive layer 24. When the thickness of the protrusion 22*a* is in the above range, the height of the first word line conductive layer 22 may be increased to a great extent, reducing the difference between heights of the first word line conductive layer 22 and of the active layer 14 of the peripheral region. In some embodiments, the thickness of the protrusion 22*a* may be less than 40 nm, lowering an overlap area of the first word line conductive layer 22 with the source drain region 111 while ensuring a great volume of the first word line conductive layer 22.

In some embodiments, referring to FIG. 4, a top surface of the protrusion 22*a* is cambered. Illustratively, the cambered surface may be of small curvature, i.e., to increase flatness of the top surface, to increase the area of the top surface of the protrusion 22*a* exposed by the second through hole 72 formed subsequently.

In some embodiments, referring to FIG. 5, the top surface of the protrusion 22*a* is flat. That is, the top surface of the protrusion 22*a* may be of one height, thus allowing the second through hole 72 subsequently formed to expose the entire top surface of the protrusion 22*a*, thereby increasing a contact area between the second contact structure 82 subsequently formed and the first word line conductive layer 22, reducing contact resistance.

Figure 6:
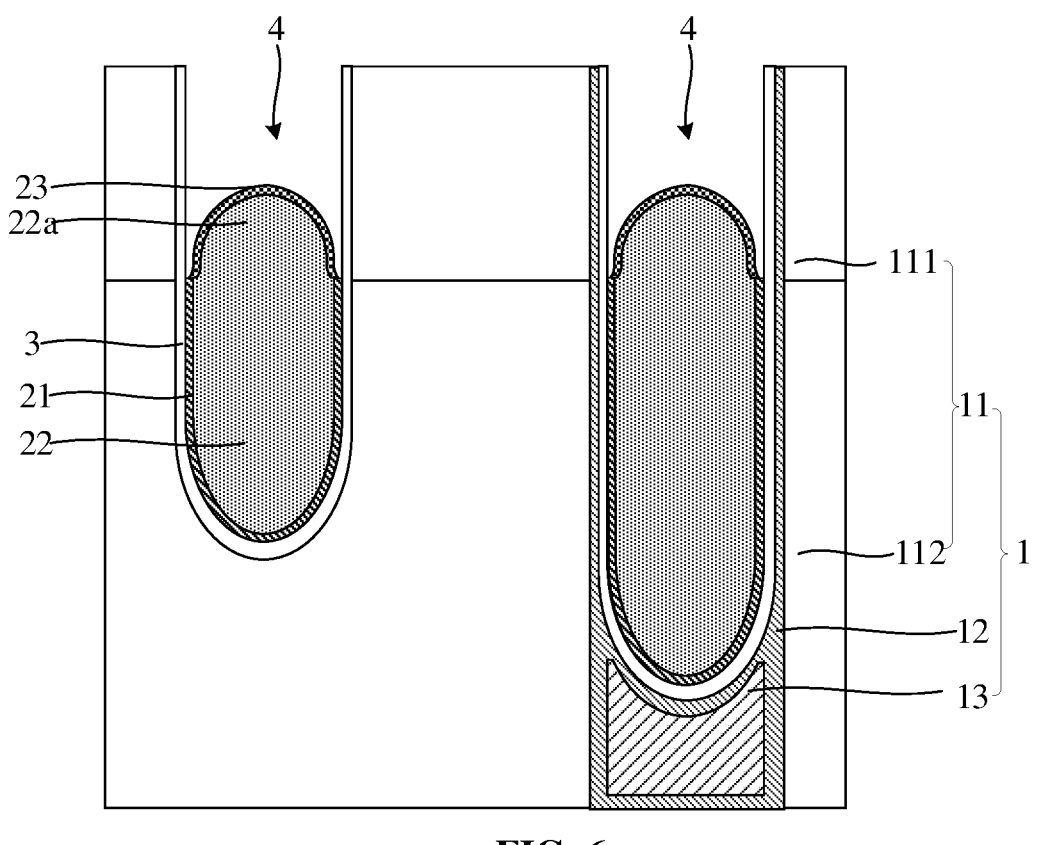
FIG. 6 illustrates a fifth diagram of a structure corresponding to a step in a method for manufacturing a semiconductor structure according to an embodiment of the present disclosure.

Referring to FIG. 6, a conformal covering second barrier layer 23 may be formed on the top surface of the first word line conductive layer 22. The second barrier layer 23 may prevent metal atoms of the first word line conductive layer 22 from diffusing into the second word line conductive layer 24 formed subsequently, thereby improving performance of the semiconductor structure. Illustratively, material such as tungsten nitride, titanium nitride, oxide, etc., may be deposited as the second barrier layer 23 on the top surface of the first word line conductive layer 22. Alternatively, nitrogen ions may be implanted directly into the top surface of the first conductive layer 22 to form the second barrier layer 23.

Figure 7:
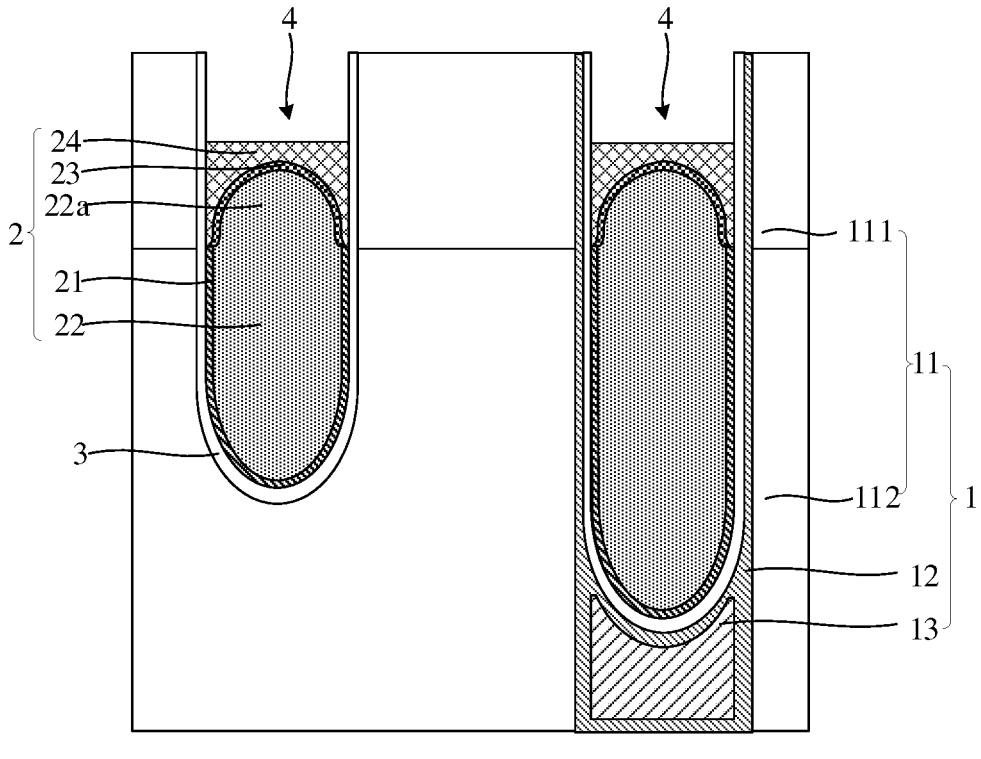
FIG. 7 illustrates a sixth diagram of a structure corresponding to a step in a method for manufacturing a semiconductor structure according to an embodiment of the present disclosure.
Figure 8:
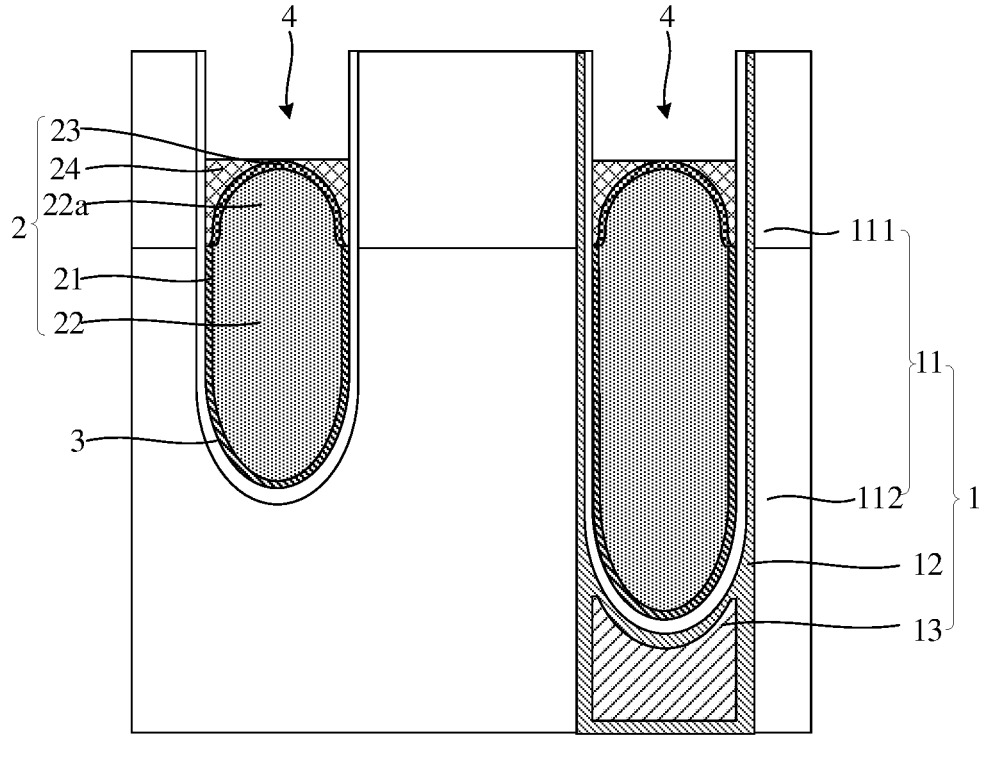
FIG. 8 illustrates a seventh diagram of a structure corresponding to a step in a method for manufacturing a semiconductor structure according to an embodiment of the present disclosure.
Figure 9:
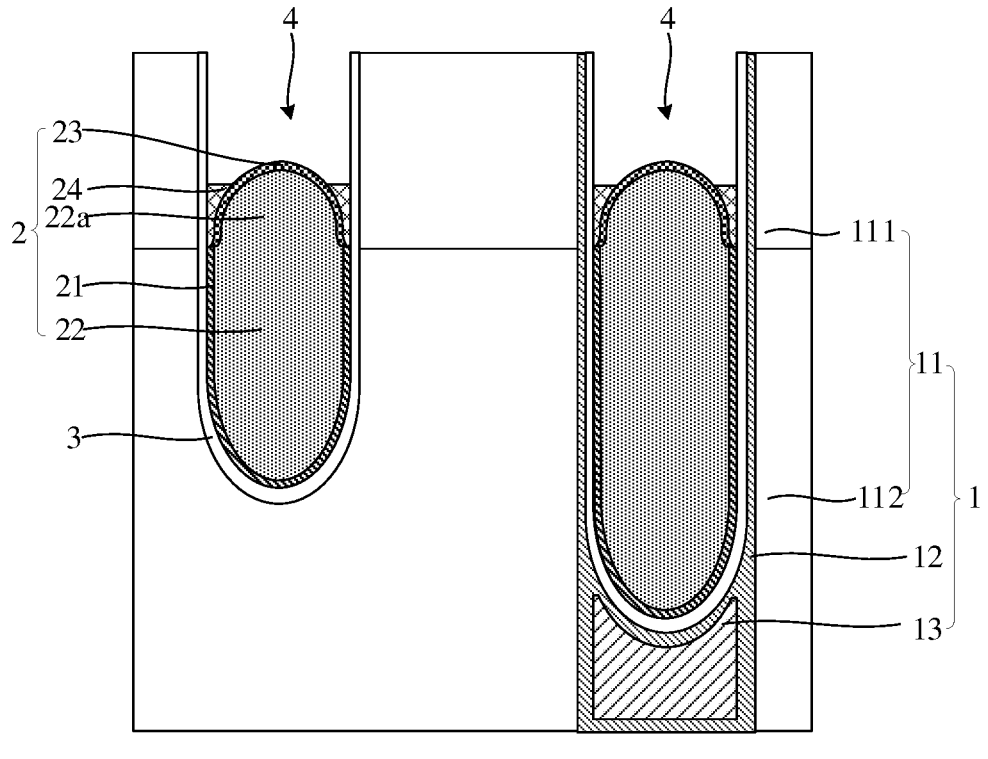
FIG. 9 illustrates an eighth diagram of a structure corresponding to a step in a method for manufacturing a semiconductor structure according to an embodiment of the present disclosure.

Referring to FIG. 7-FIG. 9, a second word line conductive layer 23 may be formed on the first word line conductive layer 22. The second word line conductive layer 24 may cover at least part of the second barrier layer 23. Illustratively, polycrystalline silicon may be deposited as an initial second word line conductive layer 24 on the first word line conductive layer 22 by chemical vapor deposition. The initial second word line conductive layer 24 may fill the word line groove 4. Etchback may be performed on the initial second word line conductive layer 24, so that the upper surface of the initial second word line conductive layer 24 is lower than the upper surface of the substrate 1, with the remaining part of the initial second word line conductive layer 24 serving as the second word line conductive layer 24. The polycrystalline silicon may be doped with ions to lower the resistance of the second word line conductive layer 24, and lower the contact resistance between the second word line conductive layer 24 and the first word line conductive layer 22. Illustratively, the polycrystalline silicon may be doped with N-type ions.

In some embodiments, the work function of the second word line conductive layer 24 is less than the work function of the first word line conductive layer 22. In addition, the work function of the second word line conductive layer 24 may also be less than the work functions of the first barrier layer 21 and of the second barrier layer 23. The second word line conductive layer 24 and the source drain region 111 have an overlap region in the direction perpendicular to the surface of the substrate 1. The low work function of the second word line conductive layer 24 allows to reduce the GIDL, thus avoiding the impact on the write recovery time and the retention time of the DRAM, thereby improving performance of the semiconductor structure.

Specifically, referring to FIG. 7, the top surface of the second word line conductive layer 24 may be higher than the top surface of the protrusion 22a. Referring to FIG. 8, the top surface of the second word line conductive layer 24 may be of the same height as the top surface of the protrusion 22a. Referring to FIG. 9, the top surface of the second word line conductive layer 24 may be lower than the top surface of of the protrusion 22a. That is, it is enough to have the second word line conductive layer 24 be located at least on the side wall of the protrusion 22a. I.e., the second word line conductive layer 24 may be located between the side wall of the word line groove 4 and the protrusion 22a.

Note that the second word line conductive layer 24, the first word line conductive layer 22, the first barrier layer 21, and the second barrier layer 23 may together form the word line 2. The word line 2 may be an embedded word line 2. The word line 2, the dielectric layer 3, and the active region 11 may form a nonplanar transistor. In some other embodiments, the first barrier layer 21 and the second barrier layer 23 may not be formed. Therefore, the first word line conductive layer 22 and the second word line conductive layer 24 may form the word line 2.

In some embodiments, the thickness of the second barrier layer 23 and the thickness of the first barrier layer 21 may be less than the thickness of the first word line conductive layer 22 in a direction perpendicular to the side wall of the word line groove 4, thus providing more space for the first word line conductive layer 22, reducing the overall resistance of the word line 2.

Hereto, based on the process steps shown in FIG. 2-FIG. 9, a word line 2 is formed in the word line groove 4. The word line 2 includes a first word line conductive layer 22 and a second word line conductive layer 24 with one stacked on another. A top of the first word line conductive layer 22 is a protrusion 22a. The protrusion 22a protrudes along a direction pointing from the first word line conductive layer 22 to the second word line conductive layer 24.

Figure 10:
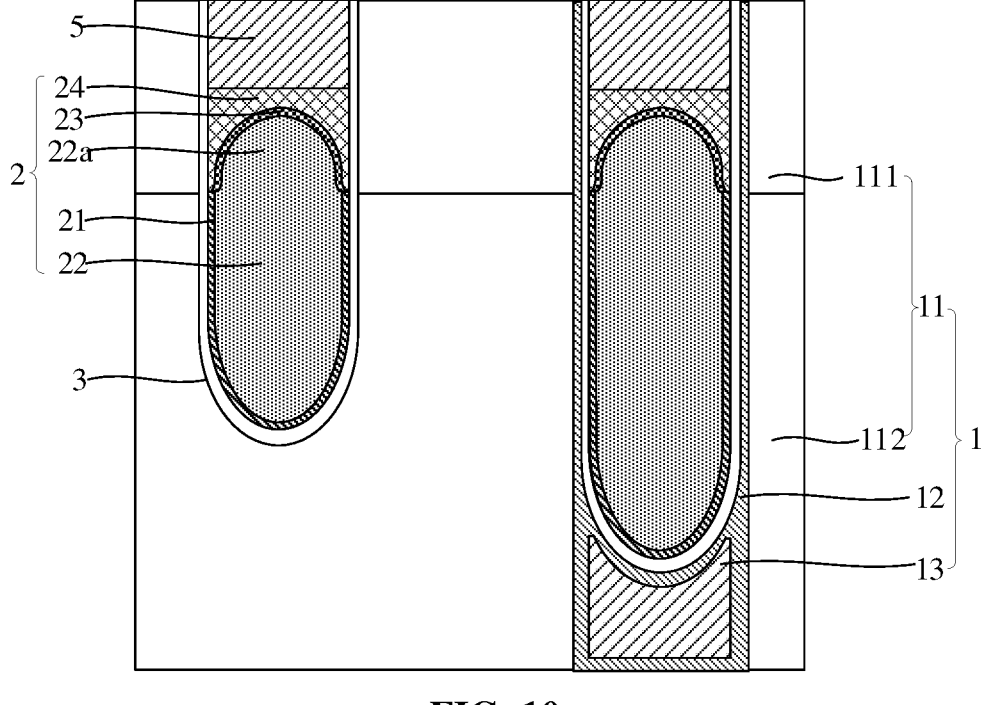
FIG. 10 illustrates a ninth diagram of a structure corresponding to a step in a method for manufacturing a semiconductor structure according to an embodiment of the present disclosure.
Figure 11:
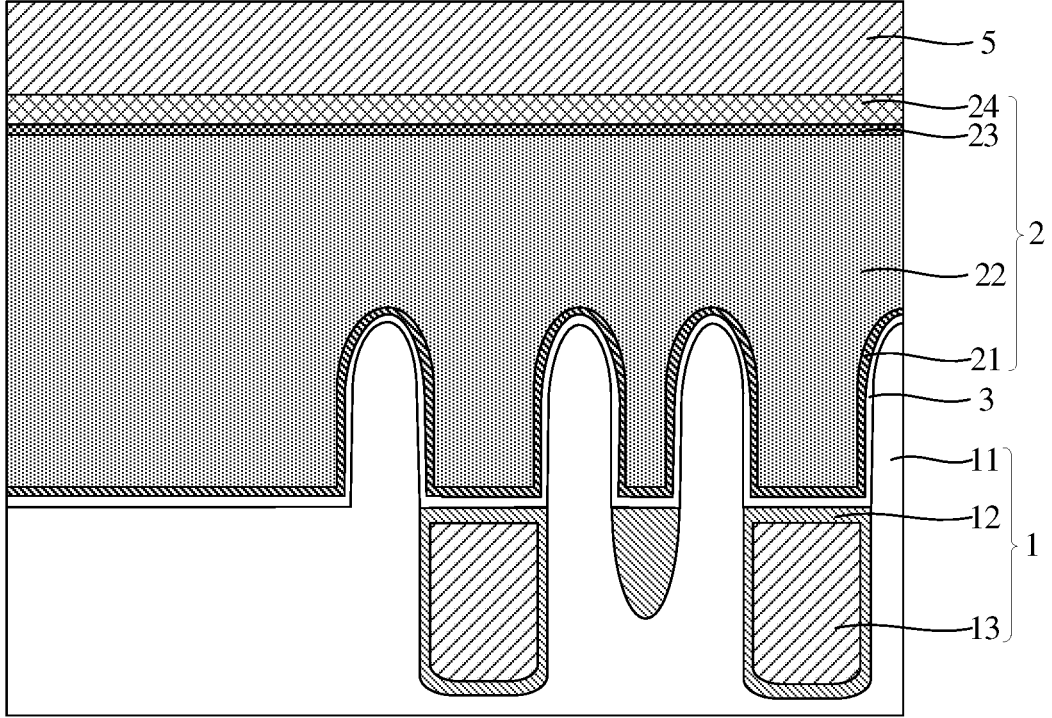
FIG. 11 illustrates a tenth diagram of a structure corresponding to a step in a method for manufacturing a semiconductor structure according to an embodiment of the present disclosure.
Figure 12:
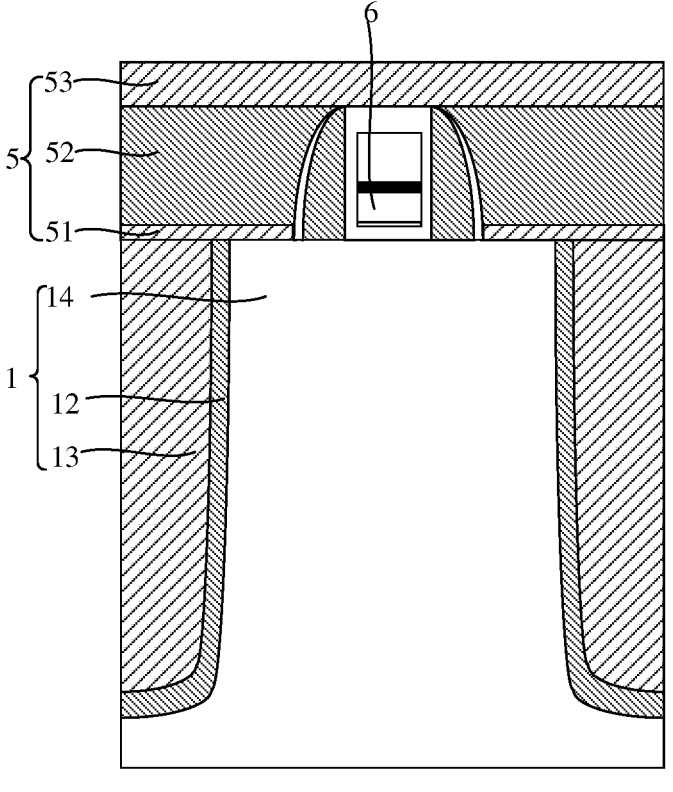
FIG. 12 illustrates an eleventh diagram of a structure corresponding to a step in a method for manufacturing a semiconductor structure according to an embodiment of the present disclosure.

FIG. 10 and FIG. 11 each illustrate an array region. FIG. 10 is a sectional view in the direction A-A1 shown in FIG. 1. FIG. 11 is a sectional view in the direction B-B1 shown in FIG. 1. FIG. 12 is a sectional view of a peripheral region. Referring to FIG. 10-FIG. 12, an isolation layer 5 covering the substrate 1 is formed. The isolation layer 5 of the array region may also fill the word line groove 4 and cover the word line 2. The isolation layer 5 of the peripheral region may cover the active layer 14. The isolation layer 5 allows to protect the word line 2 and the active layer 14.

Specifically, referring to FIG. 10 and FIG. 11, the isolation layer 5 of the array region may be a single-layer structure. For example, the isolation layer 5 of the array region may be of silicon nitride or silicon oxynitride. Referring to FIG. 12, the isolation layer 5 of the peripheral region may include a first isolation layer 51, a second isolation layer 52, and a third isolation layer 53 with one stacked on another. The first isolation layer 51 and the third isolation layer 53 may be of the same material, which may be different from the material of the second isolation layer 52. Illustratively, the first isolation layer 51 and the third isolation layer 53 may be made of silicon nitride, and the second isolation layer 52 may be made of silicon oxide. In some other embodiments, the isolation layer 5 of the array region and of the peripheral region may both be single-layered, or both be multi-layered, thereby allowing simplification of a production process.

In some embodiments, referring to FIG. 12, before the isolation layer 5 is formed, the method may also includes an option as follows. A gate structure 6 may be formed on the active layer 14. The isolation layer 5 may cover the gate structure 6. In other words, the active layer 14 and the gate structure 6 may form a transistor.

Figure 13:
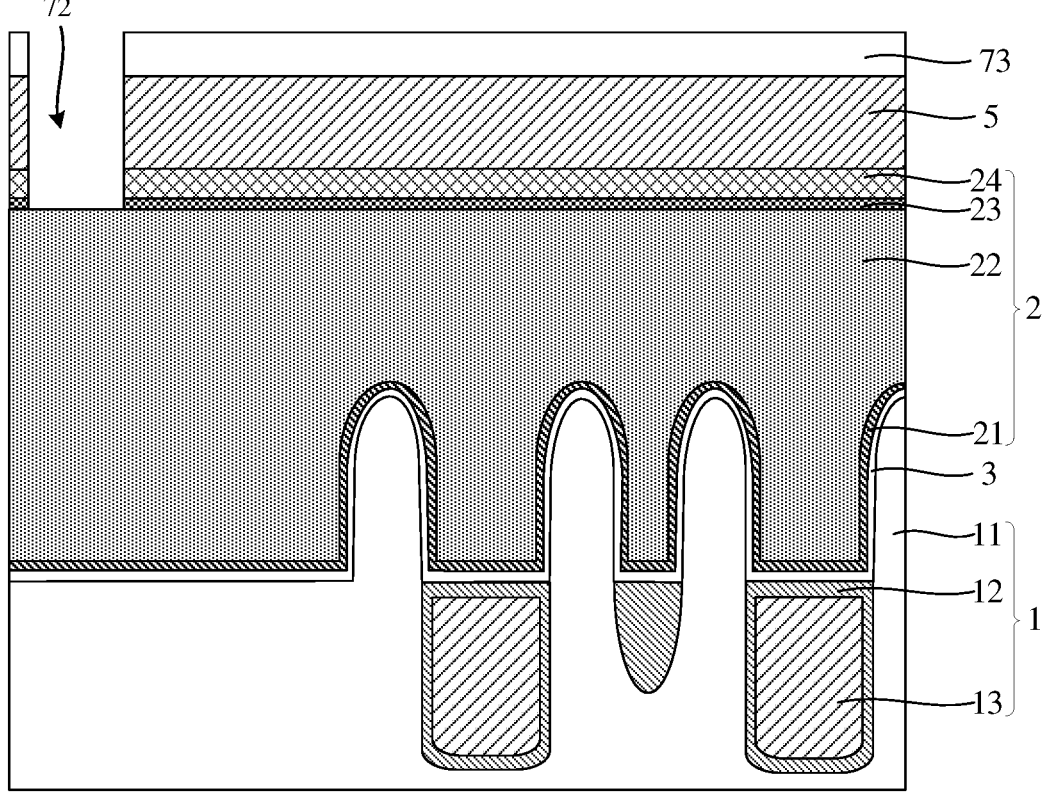
FIG. 13 illustrates a twelfth diagram of a structure corresponding to a step in a method for manufacturing a semiconductor structure according to an embodiment of the present disclosure.
Figure 14:
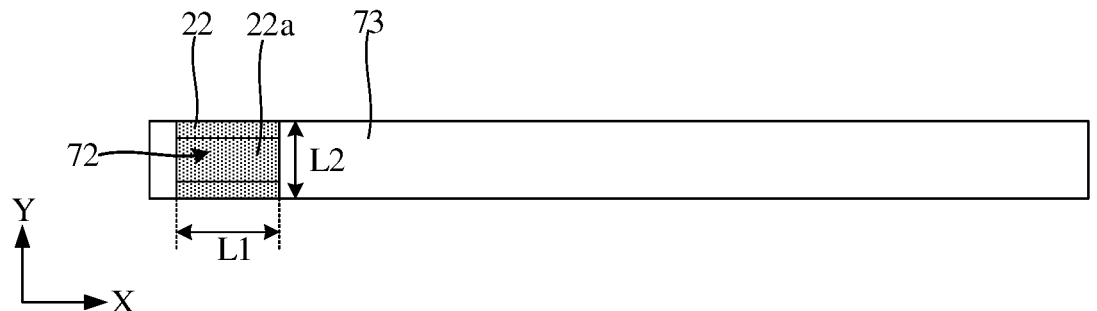
FIG. 14 illustrates a thirteenth diagram of a structure corresponding to a step in a method for manufacturing a semiconductor structure according to an embodiment of the present disclosure.
Figure 15:
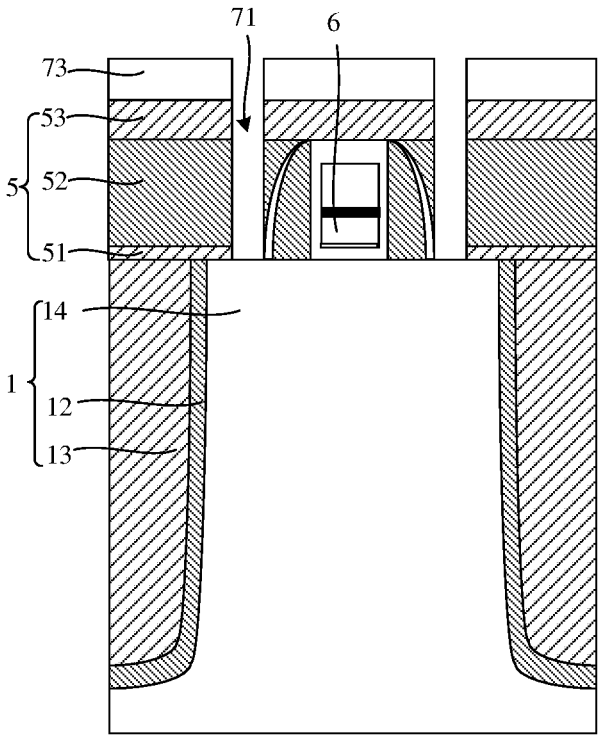
FIG. 15 illustrates a fourteenth diagram of a structure corresponding to a step in a method for manufacturing a semiconductor structure according to an embodiment of the present disclosure.
Figure 16:
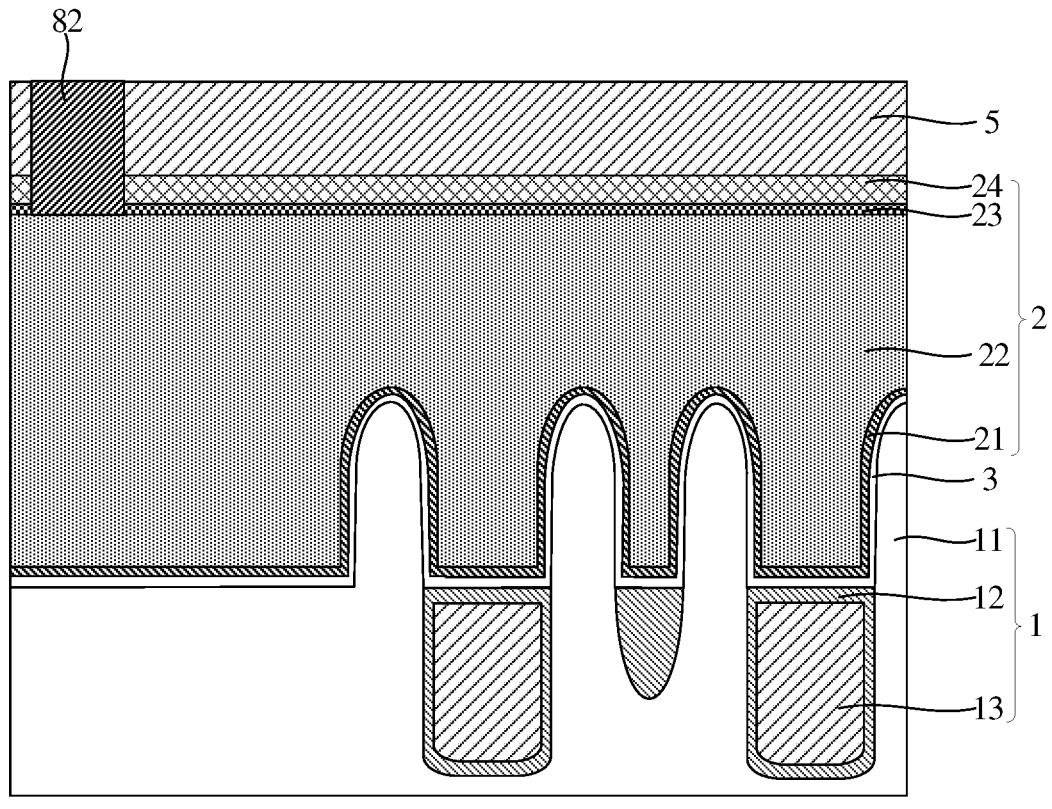
FIG. 16 illustrates a fifteenth diagram of a structure corresponding to a step in a method for manufacturing a semiconductor structure according to an embodiment of the present disclosure.

FIG. 13 is a sectional view of the semiconductor structure in the direction B-B1 shown in FIG. 1. FIG. 14 is a top perspective view of part of the array region. FIG. 14 shows just the first word line conductive layer 22, a photoresist layer 73, and a second through hole 72. FIG. 15 is a sectional view of the peripheral region. Referring to FIG. 13-FIG. 15, a first through hole 71 and a second through hole 72 both penetrating through the isolation layer 5 are formed simultaneously. The first through hole 71 exposes the active layer 14. The second through hole 72 exposes the protrusion 22a.

Specifically, a photoresist layer 73 is formed on the isolation layer 5. A first opening and a second opening may be formed at the same time by photoetching the photoresist layer 73. The first opening may be located in the peripheral region. The second opening may be located in the array region. The first through hole 71 may align with the first opening formed subsequently. The second through hole 72 may align with the second opening. That is, the locations of the first through hole 71 and the second through hole 72 may be defined simultaneously by one photoetching process, without having to define the locations of the first through hole 71 and the second through hole 72 respectively with two photoetching processes.

Refer again to FIG. 13-FIG. 15, the first through hole 71 and the second through hole 72 may be formed by etching the isolation layer 5 simultaneously along the first opening and the second opening. Note that the protrusion 22a allows to increase the height of the first word line conductive layer 22, thereby reducing a difference between height of the top surface of the first word line conductive layer 22 and height of the top surface of the active layer 14 of the peripheral region. That is, the first word line conductive layer 22 and the active layer 14 are embedded at closer depths in the substrate 1, allowing to etch the isolation layer 5 of both the peripheral region and the array region simultaneously by one etching process, to form the first through hole 71 and the second through hole 72 at the same time. The one etching process allows both the first through hole 71 and the second through hole 72 to reach a preset depth, avoiding overetch of the active layer 14 while ensuring exposure of the first word line conductive layer 22. Therefore, it is not required to use two etching processes to etch the isolation layer 5 of the peripheral region and of the array region, respectively, simplifying process steps, reducing a production cost.

Note that if the top surface of the second word line conductive layer 24 is of the same height as, or higher than, the top surface of the protrusion 22a, then in forming the second through hole 72, part of the second word line conductive layer 24 may have to be removed to expose the protrusion 22a, so as to allow direct electric connection of the second contact structure 82 subsequently formed to the first word line conductive layer 22. if the top surface of the second conductive layer 24 is lower than the top surface of the protrusion 22a, the isolation layer 5 on the top surface of the protrusion 22a may be removed straightforwardly without having to remove the second word line conductive layer 24.

In addition, in forming the second through hole 72, part of the top end of the protrusion 22a may be removed. In other words, if the top surface of the protrusion 22a is cambered, the cambered top surface of the protrusion 22a may be etched and converted into a flat surface. Alternatively, selective etching may be performed to have the entire protrusion 22a, i.e., the top surface of the protrusion 22a, remain cambered. This will be elaborated below with reference to the relation between locations of the second contact structure 82 and the protrusion 22a.

Referring to FIG. 13-FIG. 14, the second through hole 72 may be located at an edge of the array region. The second through hole 72 may have a first width L1 in an extension direction of the word line groove 4. I.e., the first width L1 may be a width in the first direction X. The second through hole 72 may have a second width L2 in a direction perpendicular to a side wall of the word line grove 4. I.e., the second width may be a width in the second direction Y. The first width L1 may be greater than the second width L2. Note that in the second direction Y, the top end of the protrusion 22a may occupy just part of space of the word line groove 4. That is, the width of contact of the first word line conductive layer 22 with the subsequently formed second contact structure 82 in the second direction Y may be small. Therefore, the width of contact of the first word line conductive layer 22 with the second contact structure 82 in the first direction X may be increased appropriately. I.e., the width of the second through hole 72 in the first direction X may be increased, thus increasing the contact area of the first word line conductive line layer 22 with the second contact structure 82.

Illustratively, a difference between the first width L1 and the second width L2 may be greater than 10 nm. When the difference between the two is kept in the range, a suitable contact area between the second contact structure 82 formed subsequently and the first word line conductive layer 22 is allowed, thereby lowering contact resistance. In addition, the difference between the first width L1 and the second width L2 may also be less than 50 nm, to avoid occupying space of another structure in the first direction X by the second contact structure 82.

The second through hole 72 may be greater than or equal to the protrusion 22a in width in a direction perpendicular to a side wall of the word line groove 4. That is, the area of the top surface of the protrusion 22a exposed by the second through hole 72 may be increased in the second direction Y, thereby increasing the contact area between the subsequently formed second contact structure 82 and the protrusion 22a, as well as increasing the volume of the second contact structure 82, reducing resistance of the second contact structure 82. For example, the second width L2 of the second through hole 72 may also be equal to the width of the word line groove 4. That is, the second through hole 72 may expose the side wall of the word line groove 4, allowing the second contact structure 82 to be equal to the word line groove 4 in width along the second direction Y.

Referring to FIG. 15, there may be at least two first through holes 71. Two of the first through holes 71 may be located on both sides of the gate structure 6. That is, the first through holes 71 may expose the source and the drain on both sides of the gate structure 6.

Referring to FIG. 16-FIG. 20, the method for manufacturing a semiconductor structure may further include an option as follows. A first contact structure 81 filling the first through hole 71 and a second contact structure 82 filling the second through hole 72 may be formed. The first contact structure 81 may be connected to the active layer 14. The second contact structure 82 may be connected to the word line 2. That is, the first contact structure 81 allows lead-out of the active layer 14 in the substrate 1, and the second contact structure 82 allows lead-out of the word line 2 in the substrate 1.

Illustratively, initial contact structures may be formed in the first through hole 71 and the second through hole 72, as well as on the surface of the isolation layer 5. An initial contact structure may be flattened to remove the initial contact structure located on the surface of the isolation layer 5, with the remaining part of the initial contact structure in the first through hole 71 serving as the first contact structure 81, the remaining part of the initial contact structure in the second through hole 72 serving as the second contact structure 82. An initial contact structure may be made of metal of low resistance, such as copper, tungsten, titanium, etc. In addition, the initial contact structure may also be made of the same material as the first word line conductive layer 22.

In some embodiments, referring to FIG. 16-FIG. 19, the second contact structure 82 may be connected directly to both the first word line conductive layer 22 and the second word line conductive layer 24. The reason that the second contact structure 82 is not connected to the first word line conductive layer 22 via an indirect electric connection through the second word line conductive layer 24 is as follows. The resistance of the first word line conductive layer 22 is less than the resistance of the second word line conductive layer 24, and the work function of the first word line conductive layer 22 is greater than the work function of the second word line conductive layer 24. Direct connection of the second contact structure 82 to the first word line conductive layer 22 allows to reduce the contact resistance, and enhance the electric field formed between the first word line conductive layer 22 and the channel region 112, thereby improving gating capability.

Figure 17:
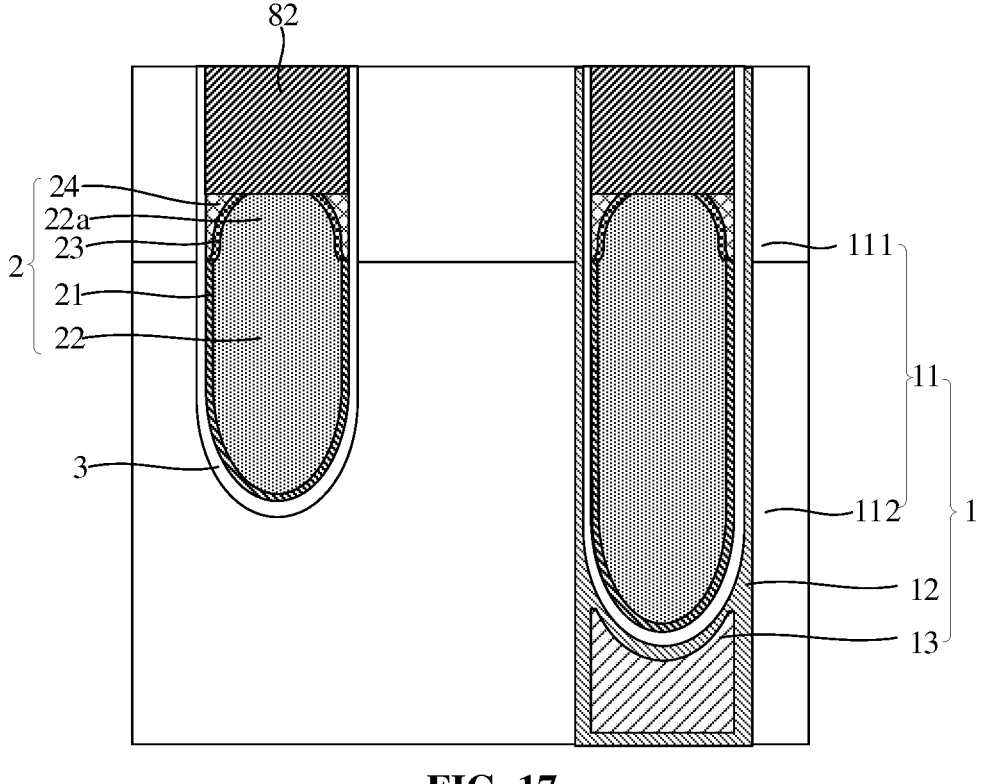
FIG. 17 illustrates a sixteenth diagram of a structure corresponding to a step in a method for manufacturing a semiconductor structure according to an embodiment of the present disclosure.
Figure 18:
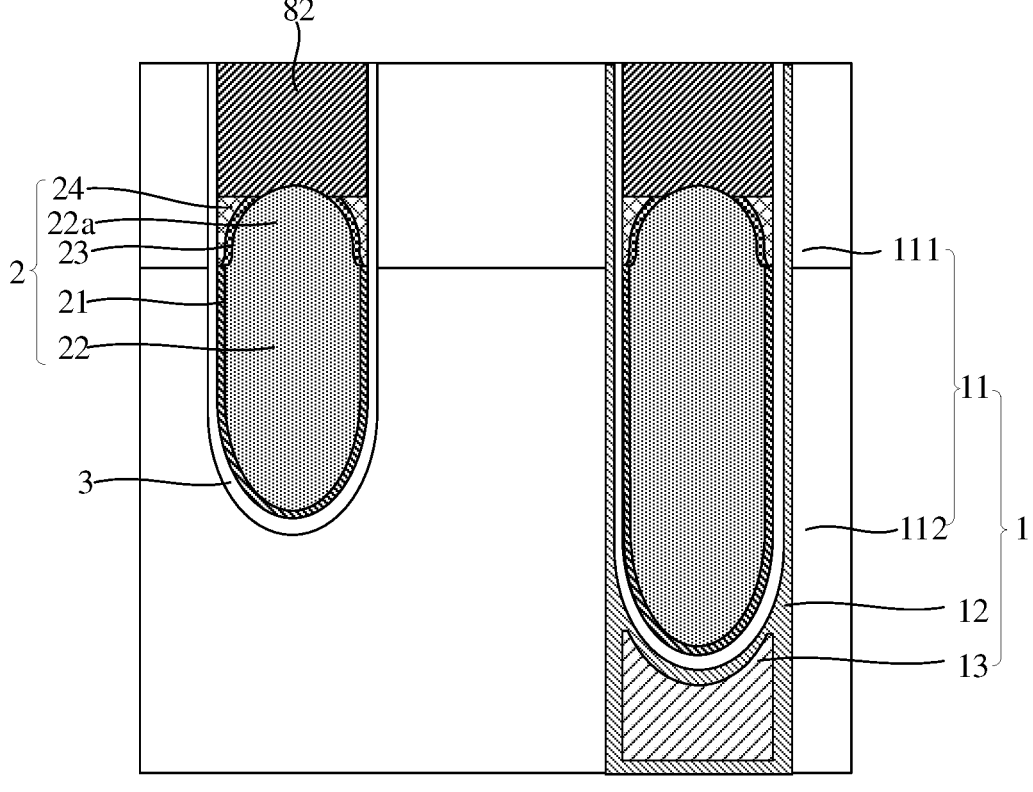
FIG. 18 illustrates a seventeenth diagram of a structure corresponding to a step in a method for manufacturing a semiconductor structure according to an embodiment of the present disclosure.
Figure 19:
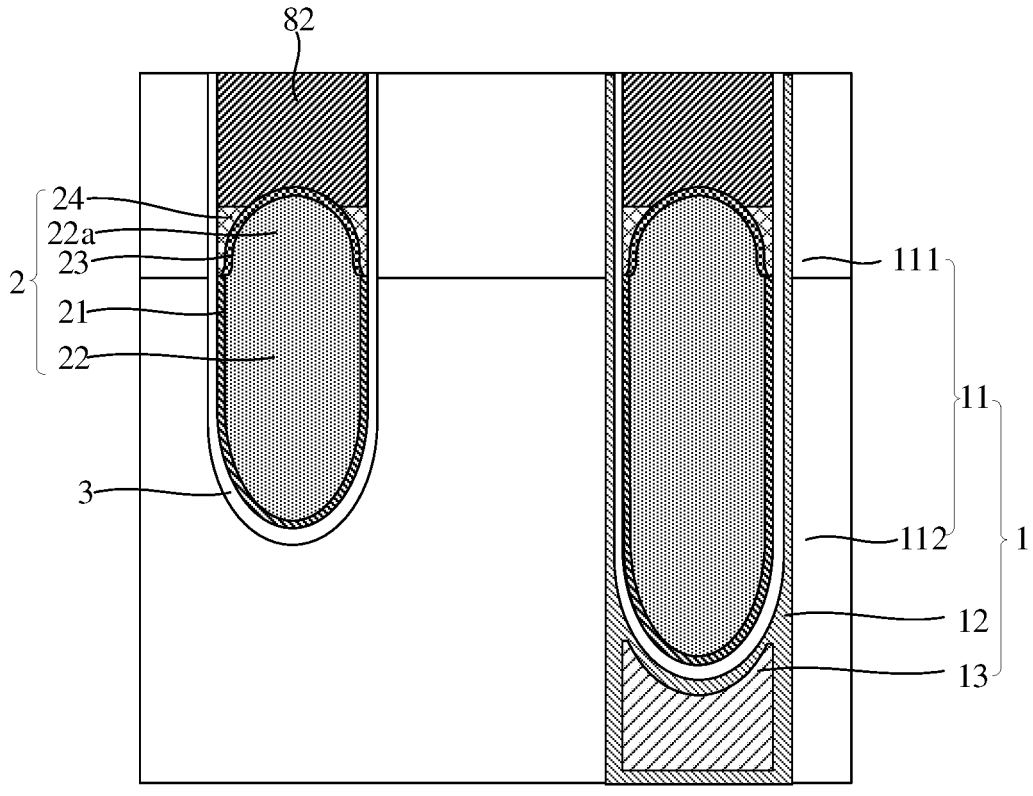
FIG. 19 illustrates an eighteenth diagram of a structure corresponding to a step in a method for manufacturing a semiconductor structure according to an embodiment of the present disclosure.
Figure 20:
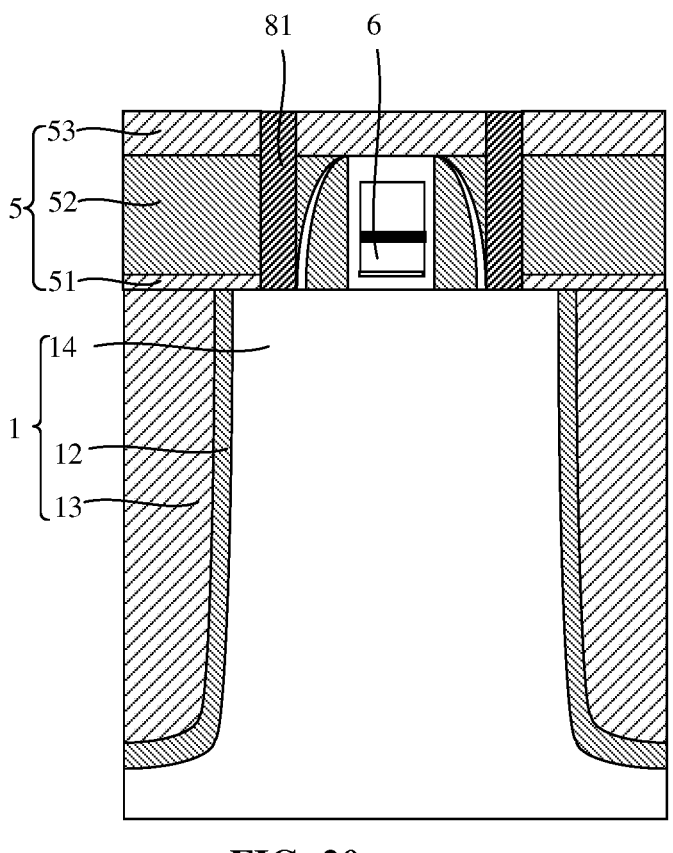
FIG. 20 illustrates a nineteenth diagram of a structure corresponding to a step in a method for manufacturing a semiconductor structure according to an embodiment of the present disclosure.

FIG. 17-FIG. 19 illustrate several relations between locations of the second contact structure 82 and the protrusion 22a. Specifically, referring to FIG. 17-FIG. 18, the protrusion 22a may be in direct contact with the second contact structure 82, with the second barrier layer 23 between the protrusion and the second contact structure being removed while forming the second through hole 72, thereby lowering the contact resistance between the protrusion and the second contact structure.

Referring to FIG. 17, the protrusion 22a may be in flat contact with the second contact structure 82. In other words, part of the top end of the protrusion 22a may be removed while forming the second through hole 72.

Referring to FIG. 18, the protrusion 22a may be in cambered contact with the second contact feature 82, thereby increasing the contact area between the protrusion and the second contact structure, reducing contact resistance. That is, in forming the second through hole 72, an etching agent of a high selection ratio may be used so that the protrusion 22a is not etched.

In some other embodiments, referring to FIG. 19, the second barrier layer 23 may remain between the protrusion 22a and the second contact structure 82. In addition, the protrusion 22a and the second contact structure 82 may be in cambered contact, with a great contact area, and low contact resistance.

Referring to FIG. 1, each word line 2 may be connected to a second contact structure 82. Second contact structures 82 connected to adjacent word lines 2 may be staggered. That is, the word lines 2 may have opposite ends in the first direction X, and second contact structures 82 connected to adjacent word lines 2 my be located at different ends of the word lines 2. Therefore, adjacent second contact structures 82 at the same end may be spaced by one word line 2, thus increasing the spacing between the adjacent second contact structures 82, thereby reducing parasitic capacitance between adjacent second contact structures 82, improving an operation rate of the semiconductor structure.

In addition, adjacent second contact features 82 at the same end may be staggered. That is, two adjacent second contact features may not face each other directly in the second direction Y. It may be understood that the less a direct facing area is, the less the parasitic capacitance. Therefore, the width of a second contact structure 82 in the first direction X may be increased suitably, thereby increasing the contact area between the second contact structure 82 and the first word line conductive layer 22. That is, even if widths of second contact structures 82 in the first direction X are large, no large parasitic capacitance is generated between adjacent second contact structures 82 due to large spacing and the small direct facing area between adjacent second contact structures 82.

To sum up, in embodiments of the present disclosure, a protrusion 22a is formed atop a first word line conductive layer 22, increasing the height of the top surface of the first word line conductive layer 22, thereby reducing the difference between height of the top surface of the first word line conductive layer 22 and height of the top surface of the peripheral region. This allows to subsequently form a first through hole 71 and a second through hole 72 at the same time, simplifying a production process, reducing a production cost. In addition, the protrusion 22a allows to reduce an overlap area between the first word line conductive layer 22 and the source drain region 111, thus lowering the GIDL, thereby avoiding impact of the leakage on the retention time and the write recovery time of the DRAM.

As shown in FIG. 16-FIG. 20, embodiments of the present disclosure further provide a semiconductor structure. The semiconductor structure may be manufactured using a method for manufacturing a semiconductor structure according to the foregoing embodiments. Refer to the foregoing embodiments for detailed description of the semiconductor structure.

A semiconductor structure includes a peripheral region and an array region. The semiconductor structure includes: a substrate 1, an active layer 14 being provided in the substrate corresponding to the peripheral region; a word line 2 formed in the substrate corresponding to the array region, the word line 2 including a first word line conductive layer 22 and a second word line conductive layer 24 with one stacked on another, a top of the first word line conductive layer 22 being a protrusion 22a, the protrusion 22a protruding along a direction pointing from the first word line conductive layer 22 to the second word line conductive layer 24; and an isolation layer 5 covering the substrate 5, a first contact structure 81 and a second contact structure 82 being formed in the isolation layer 5, the first contact structure 81 being connected to the active layer 14, the second contact structure 82 being connected to the word line 2.

That is, the protrusion 22a allows to reduce the difference between height of the top surface of the first word line conductive layer 22 and height of the top surface of the active layer 14 of the peripheral region, thereby allowing simultaneous formation of the first contact structure 81 and the second contact structure 82.

Illustratively, the second contact structure 82 may be in contact with a word line groove 4. That is, the second contact structure 82 may be equal to the word line groove 4 in width along the second direction Y, increasing the volume of the second contact structure 82, reducing resistance of the second contact structure 82.

In some embodiments, referring to FIG. 17-FIG. 19, within a projection region of the second contact structure 82 on the substrate 1, a projection region of the second word line conductive layer 24 on the substrate 1 may be located on both sides of a projection region of the protrusion 22a on the substrate 1. The second contact structure 82 may be in contact with both the first word line conductive layer 22 and the second word line conductive layer 24. That is, two sides of the top end of protrusion 22a may be provided spaced apart from the word line groove 4. The second word line conductive layer 24 may be located in a gap between the two sides of the protrusion 22a and the word line groove 4. This allows to reduce the contact area between the second word line conductive layer 24 and the source drain region 111, thereby reducing the GIDL.

Embodiments of the present disclosure provide a method for manufacturing a semiconductor structure and a semiconductor structure, capable of at least simplifying process steps for a semiconductor structure, thereby reducing a production cost.

According to some embodiments of the present disclosure, an aspect herein provides a method for manufacturing a semiconductor structure. The method includes: providing a substrate, an active layer being provided in the substrate corresponding to the peripheral region; forming a word line groove in the substrate corresponding to the array region; forming a word line in the word line groove, the word line including a first word line conductive layer and a second word line conductive layer with one stacked on another, a top of the first word line conductive layer being a protrusion, the protrusion protruding along a direction pointing from the first word line conductive layer to the second word line conductive layer; forming an isolation layer covering the substrate; and simultaneously forming a first through hole and a second through hole both penetrating through the isolation layer, the first through hole exposing the active layer, the second through hole exposing the protrusion.

According to some embodiments of the present disclosure, another aspect herein provides a semiconductor structure. The semiconductor structure includes: a substrate, an active layer being provided in the substrate corresponding to the peripheral region; a word line formed in the substrate corresponding to the array region, the word line including a first word line conductive layer and a second word line conductive layer with one stacked on another, a top of the first word line conductive layer being a protrusion, the protrusion protruding along a direction pointing from the first word line conductive layer to the second word line conductive layer; and an isolation layer covering the substrate, a first contact structure and a second contact structure being formed in the isolation layer, the first contact structure being connected to the active layer, the second contact structure being connected to the word line.

A technical solution provided by embodiments of the present disclosure includes beneficial effects at least as follows. A top of the first word line conductive layer is a protrusion protruding upwards. The protrusion allows to reduce a difference between height of the top surface of the first word line conductive layer and height of the top surface of an active layer, thus allowing integration of process steps of a first through hole and of a second through hole, thereby reducing a production cost.

In the present disclosure, description with reference to a term such as "some embodiments", "illustratively", etc., refers to that a specific feature, structure, material, characteristics, etc., described with reference to the embodiment or example is included in at least one embodiment or example of the present disclosure. In the present disclosure, the term is not necessarily schematically expressed for the same embodiment or example. Moreover, the specific feature, structure, material, characteristics, etc., described may be combined in a proper manner in any one or more embodiments or examples. In addition, a person having ordinary skill in the art may integrate and combine different embodiments or examples described in the present disclosure and features of different embodiments or examples as long as no contradiction results.

Embodiments of the present disclosure have been shown and described. However, it may be understood that the embodiments are illustrative and should not be construed as limiting the present disclosure. A person having ordinary skill in the art may make change, modification, replacement, and transformation to the embodiments within the scope of the present disclosure. Therefore, it is intended that any change or modification made in light of the claims and the specification of the present disclosure falls within the scope of the present disclosure.

What is claimed is:

1. A method for manufacturing a semiconductor structure, the semiconductor structure comprising a peripheral region and an array region, the method comprising:

providing a substrate, an active layer being provided in the substrate corresponding to the peripheral region;

forming a word line groove in the substrate corresponding to the array region;

forming a word line in the word line groove, the word line comprising a first word line conductive layer and a second word line conductive layer with one stacked on another, a top of the first word line conductive layer being a protrusion, the protrusion protruding along a direction pointing from the first word line conductive layer to the second word line conductive layer;

forming an isolation layer covering the substrate; and simultaneously forming a first through hole and a second through hole both penetrating through the isolation layer, the first through hole exposing the active layer, the second through hole exposing the protrusion.

2. The method of claim 1, wherein simultaneously forming the first through hole and the second through hole both penetrating through the isolation layer comprises:

forming a photoresist layer on the isolation layer; forming a first opening and a second opening at the same time by photoetching the photoresist layer, the first opening being located in the peripheral region, the second opening being located in the array region; and forming the first through hole and the second through hole by etching the isolation layer simultaneously along the first opening and the second opening, the first through hole aligning with the first opening, the second through hole aligning with the second opening.

3. The method of claim 1, wherein forming the first word line conductive layer comprises:

forming an initial first word line conductive layer filling the word line groove;

performing a first etching process that makes an upper surface of the initial first word line conductive layer be lower than an upper surface of the substrate;

performing a second etching process that shapes the top of the initial first word line conductive layer into the protrusion, with a remaining part of the initial first word line conductive layer serving as the first word line conductive layer.

4. The method of claim 1, wherein a top of the protrusion is provided spaced apart from a side wall of the word line groove.

5. The method of claim 4, wherein the top of the protrusion is at equal distance to two opposite side walls of the word line groove.

6. The method of claim 4, wherein the protrusion is in contact with the word line groove.

7. The method of claim 1, wherein the protrusion extends along an extension direction same as that of the word line groove, parallel to an upper surface of the substrate, and the protrusion and the word line groove are equal in length along the extension direction.

8. The method of claim 1, wherein the second through hole has a first width in an extension direction of the word line groove, the second through hole has a second width in a direction perpendicular to a side wall of the word line grove, and the first width is greater than the second width.

9. The method of claim 8, wherein a difference between the first width and the second width is greater than 10 nm.

10. The method of claim 1, wherein a thickness of the protrusion in the direction pointing from the first word line conductive layer to the second word line conductive layer is greater than 20 nm.

11. The method of claim 1, wherein a top surface of the protrusion is flat, or the top surface of the protrusion is cambered.

12. The method of claim 1, wherein a work function of the first word line conductive layer is greater than a work function of the second word line conductive layer.

13. The method of claim 1, wherein the second through hole is greater than or equal to the protrusion in width in a direction perpendicular to a side wall of the word line groove.

14. The method of claim 1, further comprising: forming a first contact structure filling the first through hole and a second contact structure filling the second through hole, the first contact structure being connected to the active layer, the second contact structure being connected to the word line.

15. The method of claim 1, further comprising: before forming the isolation layer, forming a gate structure on the active layer, wherein the isolation layer covers the gate structure, the first through hole comprises at least two first through holes, and two first through holes of the at least two first through holes are located on both sides of the gate structure.

* * * * *